United States Patent
Hwang et al.

(10) Patent No.: US 9,685,372 B2
(45) Date of Patent: Jun. 20, 2017

(54) METHOD OF FORMING CU PILLAR BUMP WITH NON-METAL SIDEWALL SPACER AND METAL TOP CAP

(71) Applicant: TAIWAN SEMICONDUCTOR MANUFACTURING COMPANY, LTD., Hsinchu (TW)

(72) Inventors: Chien Ling Hwang, Hsinchu (TW); Hui-Jung Tsai, Hsinchu (TW); Yi-Wen Wu, Xizhi (TW); Chung-Shi Liu, Shin-Chu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/694,524

(22) Filed: Apr. 23, 2015

(65) Prior Publication Data
US 2015/0228533 A1    Aug. 13, 2015

Related U.S. Application Data

(62) Division of application No. 12/792,002, filed on Jun. 2, 2010, now Pat. No. 9,018,758.

(51) Int. Cl.
*H01L 21/768* (2006.01)
*C23C 14/34* (2006.01)
(Continued)

(52) U.S. Cl.
CPC ......... *H01L 21/7688* (2013.01); *C23C 14/34* (2013.01); *C25D 5/022* (2013.01);
(Continued)

(58) Field of Classification Search
CPC ......... H01L 21/7688; H01L 21/76883; H01L 21/76879; H01L 24/11; H01L 24/13; H01L 24/81
(Continued)

(56) References Cited

U.S. PATENT DOCUMENTS 4,380,867 A   4/1983 Antson
4,720,740 A   1/1988 Clements et al.
(Continued)

FOREIGN PATENT DOCUMENTS

JP   1993335313   12/1993
JP   2000228420    8/2000
(Continued)

OTHER PUBLICATIONS

Kim, K. S., et al., "The Interface Formation and Adhesion of Metals (Cu, Ta, and Ti) and Low Dielectric Constant Polymer-Like Organic Thin Films Deposited by Plasma-Enhanced Chemical Vapor Deposition Using Para-Xylene Precursor", Thin Solid Films 377-378 (2000), pp. 122-128.
(Continued)

*Primary Examiner* — Julia Slutsker
*Assistant Examiner* — Dmitriy Yemelyanov
(74) *Attorney, Agent, or Firm* — Hauptman Ham, LLP

(57) ABSTRACT

A method of forming an integrated circuit device includes forming a conductive element over a substrate, wherein the conductive element is over an under bump metallurgy (UBM) layer, and the UBM layer comprises a first UBM layer and a second UBM layer over the first UBM layer. The method further includes etching the second UBM layer to expose a portion of the first UBM layer beyond a periphery of the conductive element. The method further includes forming a protection layer over sidewalls of the conductive element, over sidewalls of the second UBM layer and over a top surface of the first UBM layer. The method further includes etching the first UBM layer to remove a portion of the first UBM layer. The method further includes forming a cap layer over a top surface of the conductive element.

20 Claims, 5 Drawing Sheets

(51) Int. Cl.
*C25D 5/02* (2006.01)
*C25D 7/00* (2006.01)
*H01L 23/00* (2006.01)
*H01L 25/065* (2006.01)

(52) U.S. Cl.
CPC .......... *C25D 7/00* (2013.01); *H01L 21/76879* (2013.01); *H01L 21/76883* (2013.01); *H01L 24/05* (2013.01); *H01L 24/11* (2013.01); *H01L 24/13* (2013.01); *H01L 24/81* (2013.01); *H01L 24/83* (2013.01); *H01L 24/03* (2013.01); *H01L 24/16* (2013.01); *H01L 25/0657* (2013.01); *H01L 2224/0361* (2013.01); *H01L 2224/03826* (2013.01); *H01L 2224/03831* (2013.01); *H01L 2224/03912* (2013.01); *H01L 2224/0401* (2013.01); *H01L 2224/05166* (2013.01); *H01L 2224/05181* (2013.01); *H01L 2224/05572* (2013.01); *H01L 2224/05647* (2013.01); *H01L 2224/10126* (2013.01); *H01L 2224/1145* (2013.01); *H01L 2224/11452* (2013.01); *H01L 2224/11462* (2013.01); *H01L 2224/11464* (2013.01); *H01L 2224/11622* (2013.01); *H01L 2224/1354* (2013.01); *H01L 2224/13147* (2013.01); *H01L 2224/13565* (2013.01); *H01L 2224/16148* (2013.01); *H01L 2224/16225* (2013.01); *H01L 2224/16227* (2013.01); *H01L 2224/81024* (2013.01); *H01L 2224/81193* (2013.01); *H01L 2224/81447* (2013.01); *H01L 2224/81815* (2013.01); *H01L 2224/81911* (2013.01); *H01L 2225/06513* (2013.01); *H01L 2924/0002* (2013.01); *H01L 2924/0103* (2013.01); *H01L 2924/0104* (2013.01); *H01L 2924/014* (2013.01); *H01L 2924/0105* (2013.01); *H01L 2924/01005* (2013.01); *H01L 2924/01006* (2013.01); *H01L 2924/01012* (2013.01); *H01L 2924/01013* (2013.01); *H01L 2924/01019* (2013.01); *H01L 2924/01023* (2013.01); *H01L 2924/01024* (2013.01); *H01L 2924/01025* (2013.01); *H01L 2924/01029* (2013.01); *H01L 2924/01032* (2013.01); *H01L 2924/01033* (2013.01); *H01L 2924/01038* (2013.01); *H01L 2924/01047* (2013.01); *H01L 2924/01049* (2013.01); *H01L 2924/01073* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/1305* (2013.01); *H01L 2924/1306* (2013.01); *H01L 2924/13091* (2013.01); *H01L 2924/14* (2013.01)

(58) Field of Classification Search
USPC ....................................................... 438/613
See application file for complete search history.

(56) References Cited

U.S. PATENT DOCUMENTS

| | | | |
|---|---|---|---|
| 4,811,082 | A | 3/1989 | Jacobs et al. |
| 4,990,462 | A | 2/1991 | Sliwa, Jr. |
| 5,075,253 | A | 12/1991 | Sliwa, Jr. |
| 5,134,460 | A | 7/1992 | Brady et al. |
| 5,380,681 | A | 1/1995 | Hsu |
| 5,391,917 | A | 2/1995 | Gilmour et al. |
| 5,448,114 | A | 9/1995 | Kondoh et al. |
| 5,466,635 | A | 11/1995 | Lynch et al. |
| 5,510,298 | A | 4/1996 | Redwine |
| 5,747,881 | A | 5/1998 | Hosomi et al. |
| 5,767,001 | A | 6/1998 | Bertagnolli et al. |
| 5,841,133 | A | 11/1998 | Omi |
| 5,998,292 | A | 12/1999 | Black et al. |
| 6,002,177 | A | 12/1999 | Gaynes et al. |
| 6,184,060 | B1 | 2/2001 | Siniaguine |
| 6,187,678 | B1 | 2/2001 | Gaynes et al. |
| 6,191,493 | B1 | 2/2001 | Yasunaga et al. |
| 6,218,281 | B1 | 4/2001 | Watanabe et al. |
| 6,229,216 | B1 | 5/2001 | Ma et al. |
| 6,229,220 | B1 | 5/2001 | Saitoh et al. |
| 6,232,563 | B1 | 5/2001 | Kim et al. |
| 6,236,115 | B1 | 5/2001 | Gaynes et al. |
| 6,271,059 | B1 | 8/2001 | Bertin et al. |
| 6,279,815 | B1 | 8/2001 | Correia et al. |
| 6,322,903 | B1 | 11/2001 | Siniaguine et al. |
| 6,355,501 | B1 | 3/2002 | Fung et al. |
| 6,426,556 | B1 | 7/2002 | Lin |
| 6,434,016 | B2 | 8/2002 | Zeng et al. |
| 6,448,168 | B1 | 9/2002 | Rao et al. |
| 6,448,661 | B1 | 9/2002 | Kim et al. |
| 6,464,895 | B2 | 10/2002 | Forat et al. |
| 6,465,892 | B1 | 10/2002 | Suga |
| 6,472,293 | B1 | 10/2002 | Suga |
| 6,492,198 | B2 | 12/2002 | Hwang |
| 6,538,333 | B2 | 3/2003 | Kong |
| 6,562,653 | B1 | 5/2003 | Ma et al. |
| 6,570,248 | B1 | 5/2003 | Ahn et al. |
| 6,576,381 | B1 | 6/2003 | Hirano et al. |
| 6,578,754 | B1 | 6/2003 | Tung |
| 6,590,295 | B1 | 7/2003 | Liao et al. |
| 6,592,019 | B2 | 7/2003 | Tung |
| 6,596,619 | B1 | 7/2003 | Wang et al. |
| 6,599,778 | B2 | 7/2003 | Pogge et al. |
| 6,600,222 | B1 | 7/2003 | Levardo |
| 6,607,938 | B2 | 8/2003 | Kwon et al. |
| 6,639,303 | B2 | 10/2003 | Siniaguine |
| 6,661,085 | B2 | 12/2003 | Kellar et al. |
| 6,664,129 | B2 | 12/2003 | Siniaguine |
| 6,693,361 | B1 | 2/2004 | Siniaguine et al. |
| 6,731,003 | B2 | 5/2004 | Joshi et al. |
| 6,740,582 | B2 | 5/2004 | Siniaguine |
| 6,762,076 | B2 | 7/2004 | Kim et al. |
| 6,770,958 | B2 | 8/2004 | Wang et al. |
| 6,790,748 | B2 | 9/2004 | Kim et al. |
| 6,800,930 | B2 | 10/2004 | Jackson et al. |
| 6,818,545 | B2 | 11/2004 | Lee et al. |
| 6,828,677 | B2 | 12/2004 | Yap et al. |
| 6,841,883 | B1 | 1/2005 | Farnworth et al. |
| 6,853,076 | B2 | 2/2005 | Datta et al. |
| 6,869,831 | B2 | 3/2005 | Cowens et al. |
| 6,879,041 | B2 | 4/2005 | Yamamoto et al. |
| 6,882,030 | B2 | 4/2005 | Siniaguine |
| 6,887,769 | B2 | 5/2005 | Kellar et al. |
| 6,908,565 | B2 | 6/2005 | Kim et al. |
| 6,908,785 | B2 | 6/2005 | Kim |
| 6,917,119 | B2 | 7/2005 | Lee et al. |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,958,539 | B2 | 10/2005 | Lay et al. |
| 6,962,867 | B2 | 11/2005 | Jackson et al. |
| 6,962,872 | B2 | 11/2005 | Chudzik et al. |
| 6,975,016 | B2 | 12/2005 | Kellar et al. |
| 7,008,867 | B2 | 3/2006 | Lei |
| 7,012,333 | B2 | 3/2006 | Shimoyama et al. |
| 7,030,481 | B2 | 4/2006 | Chudzik et al. |
| 7,037,804 | B2 | 5/2006 | Kellar et al. |
| 7,049,170 | B2 | 5/2006 | Savastiouk et al. |
| 7,056,807 | B2 | 6/2006 | Kellar et al. |
| 7,060,601 | B2 | 6/2006 | Savastiouk et al. |
| 7,064,436 | B2 | 6/2006 | Ishiguri et al. |
| 7,071,546 | B2 | 7/2006 | Fey et al. |
| 7,087,538 | B2 | 8/2006 | Staines et al. |
| 7,111,149 | B2 | 9/2006 | Eilert |
| 7,122,912 | B2 | 10/2006 | Matsui |
| 7,151,009 | B2 | 12/2006 | Kim et al. |
| 7,157,787 | B2 | 1/2007 | Kim et al. |
| 7,193,308 | B2 | 3/2007 | Matsui |

(56) References Cited

U.S. PATENT DOCUMENTS

| | | |
|---|---|---|
| 7,215,033 B2 | 5/2007 | Lee et al. |
| 7,262,495 B2 | 8/2007 | Chen et al. |
| 7,271,497 B2 | 9/2007 | Joshi et al. |
| 7,276,799 B2 | 10/2007 | Lee et al. |
| 7,279,795 B2 | 10/2007 | Periaman et al. |
| 7,297,574 B2 | 11/2007 | Thomas et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,335,972 B2 | 2/2008 | Chanchani |
| 7,345,350 B2 | 3/2008 | Sinha |
| 7,355,273 B2 | 4/2008 | Jackson et al. |
| 7,391,112 B2 | 6/2008 | Li et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,462,942 B2 | 12/2008 | Tan et al. |
| 7,494,845 B2 | 2/2009 | Hwang et al. |
| 7,501,311 B2 | 3/2009 | Tsai |
| 7,528,494 B2 | 5/2009 | Furukawa et al. |
| 7,531,890 B2 | 5/2009 | Kim |
| 7,557,597 B2 | 7/2009 | Anderson et al. |
| 7,566,650 B2 | 7/2009 | Lin et al. |
| 7,576,435 B2 | 8/2009 | Chao |
| 7,592,246 B2 | 9/2009 | Akram |
| 7,648,899 B1 | 1/2010 | Banerji et al. |
| 7,825,511 B2 | 11/2010 | Daubenspeck et al. |
| 7,834,450 B2 | 11/2010 | Kang |
| 7,928,534 B2 | 4/2011 | Hsu et al. |
| 2001/0000321 A1 | 4/2001 | Takeda et al. |
| 2002/0014705 A1 | 2/2002 | Ishio et al. |
| 2002/0033531 A1 | 3/2002 | Matsushima et al. |
| 2003/0151140 A1 | 8/2003 | Nishiyama et al. |
| 2003/0156969 A1 | 8/2003 | Choi et al. |
| 2003/0216025 A1 | 11/2003 | Lu et al. |
| 2004/0166661 A1 | 8/2004 | Lei |
| 2005/0001324 A1 | 1/2005 | Dunn et al. |
| 2005/0077624 A1 | 4/2005 | Tan et al. |
| 2005/0179131 A1 | 8/2005 | Homma |
| 2006/0017160 A1 | 1/2006 | Huang |
| 2006/0043603 A1 | 3/2006 | Ranade et al. |
| 2006/0166402 A1 | 7/2006 | Lim et al. |
| 2006/0237842 A1 | 10/2006 | Shindo |
| 2006/0278982 A1 | 12/2006 | Solo |
| 2007/0023904 A1 | 2/2007 | Salmon |
| 2007/0080451 A1 | 4/2007 | Suh |
| 2007/0108606 A1 | 5/2007 | Watanabe |
| 2007/0284684 A1 | 12/2007 | Naito et al. |
| 2007/0287279 A1 | 12/2007 | Daubenspeck et al. |
| 2008/0185716 A1 | 8/2008 | Huang |
| 2008/0296764 A1 | 12/2008 | Chang et al. |
| 2009/0011543 A1 | 1/2009 | Karta et al. |
| 2009/0026608 A1 | 1/2009 | Tsai et al. |
| 2009/0045511 A1 | 2/2009 | Meyer et al. |
| 2009/0096109 A1 | 4/2009 | Iwasaki |
| 2009/0098724 A1 | 4/2009 | Yu |
| 2009/0130840 A1 | 5/2009 | Wang et al. |
| 2009/0197114 A1 | 8/2009 | Shih et al. |
| 2009/0233436 A1* | 9/2009 | Kim .................. H01L 24/11 438/614 |
| 2010/0090318 A1 | 4/2010 | Hsu et al. |
| 2010/0109159 A1 | 5/2010 | Ho et al. |
| 2010/0230810 A1 | 9/2010 | Kang et al. |
| 2011/0101523 A1 | 5/2011 | Hwang et al. |
| 2011/0101526 A1 | 5/2011 | Hsiao et al. |
| 2011/0156256 A1 | 6/2011 | Kang et al. |
| 2011/0227216 A1 | 9/2011 | Tseng et al. |
| 2011/0281432 A1 | 11/2011 | Farooq et al. |

FOREIGN PATENT DOCUMENTS

| | | |
|---|---|---|
| TW | 464927 | 11/2001 |
| TW | 200303058 | 8/2003 |
| TW | 201019440 | 5/2010 |

OTHER PUBLICATIONS

Kim, K. J., et al., "Chemical Interaction, Adhesion and Diffusion Properties at the Interface of Cu and Plasma-Treated Thiophene-Based Plasma Polymer (ThioPP) Films", Thin Solid Films 398-399 (2001), pp. 657-662.

Du, M., et al., "The Interface Formation of Copper and Low Dielectric Constant Fluoro-Polymer: Plasma Surface Modification and its Effect on Copper Diffusion", Journal of Applied Physics, vol. 85, No. 3, Feb. 1, 1999, pp. 1496-1502.

Jiang, Liang-You, et al., "Reduced Copper Diffusion in Layered Silicate/Fluorinated Polyimide (6FDS-ODA) Nanocomposites", Journal of Applied Polymer Science, vol. 92, 1422-1425 (2004).

U.S. Appl. No. 61/258,414, filed Nov. 5, 2009, Chien Ling Hwang, et al.

U.S. Appl. No. 61/238,749, filed Sep. 1, 2009, Chung-Shi Liu.

U.S. Appl. No. 61/258,393, filed Nov. 5, 2009, Chien Ling Hwang, et al.

U.S. Appl. No. 61/230,012, filed Jul. 30, 2009, Chung-Shi Liu, et al.

Chinese Office Action in Corresponding Application No. 201010546170.1 issued on Aug. 2, 2012.

Office Action dated Sep. 11, 2013 from corresponding application No. TW 099136673.

\* cited by examiner

METHOD OF FORMING CU PILLAR BUMP WITH NON-METAL SIDEWALL SPACER AND METAL TOP CAP

PRIORITY CLAIM

The present application is a divisional of U.S. application Ser. No. 12/792,002, filed Jun. 2, 2010, now U.S. Pat. No. 9,018,758, issued Apr. 28, 2015, which is incorporated herein by reference in its entirety.

RELATED APPLICATIONS

The present application is related to co-pending U.S. Ser. No. 12/730,411 filed on Mar. 24, 2010, which is expressly incorporated by reference herein in their entirety.

TECHNICAL FIELD

This disclosure relates to integrated circuit fabrication, and more particularly, to copper pillar bump structures in integrated circuit devices.

BACKGROUND

Modern integrated circuits are made up of literally millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding.

Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. An UBM generally contains an adhesion layer, a barrier layer and a wetting layer, arranged in that order, on the I/O pad. The bumps themselves, based on the material used, are classified as solder bumps, gold bumps, copper pillar bumps and bumps with mixed metals. Recently, copper pillar bump technology has been proposed. Instead of using a solder bump, the electronic component is connected to a substrate by means of a copper pillar bump, which achieves finer pitch with minimum probability of bump bridging, reduces the capacitance load for the circuits, and allows the electronic component to perform at higher frequencies.

Cu pillar bump flip-chip assembly has the following advantages: (1) better thermal/electric performance, (2) higher current carrying capacity, (3) better resistance to electromigration, thus longer bump life, (4) minimizing molding voids—more consistence gaps between Cu pillar bumps. Also, a lower cost substrate is possible by using Cu-pillar controlled solder spreading, eliminating lead-free teardrop design. Current process employs a photoresist layer with an opening, and forms a Cu pillar capped with a metal layer cap within the opening of the photoresist layer. However, the formation of the metal layer cap often leads to defects before and/or after the photoresist stripping process.

In one approach using an electroless/immersion metal deposition process, photoresist leaching may occur since the immersion medium directly contacts the photoresist layer, causing delamination of photoresist, and bath contamination and poor top coverage. In another approach of using of an electroplating metal process, the photoresist residue is observed on the substrate after stripping the photoresist layer.

In addition, copper has a tendency to be oxidized during the manufacturing process. Oxidized copper pillars may lead to poor adhesion of an electronic component to a substrate. The poor adhesion may cause serious reliability concerns due to high leakage currents. Oxidized copper pillars may also lead to underfill cracking along the interface of the underfill and the copper pillars. The cracks may propagate to the underlying low dielectric constant (low-K) dielectric layers or to the solder used to bond the copper pillars to the substrate. A sidewall protection layer is therefore needed to prevent copper oxidation, but the conventional method of processing the Cu pillar sidewall suffers from high process costs and interface delamination issues. Currently, an immersion tin (Sn) process is employed to provide a tin layer on the Cu pillar sidewalls, but there are still concerns regarding process costs, adhesion between Sn and underfill, and issues of solder wetting onto sidewalls, which is a challenge for fine pitch package technology in new generation chips.

DETAILED DESCRIPTION OF ILLUSTRATIVE EMBODIMENTS

Figure 1:
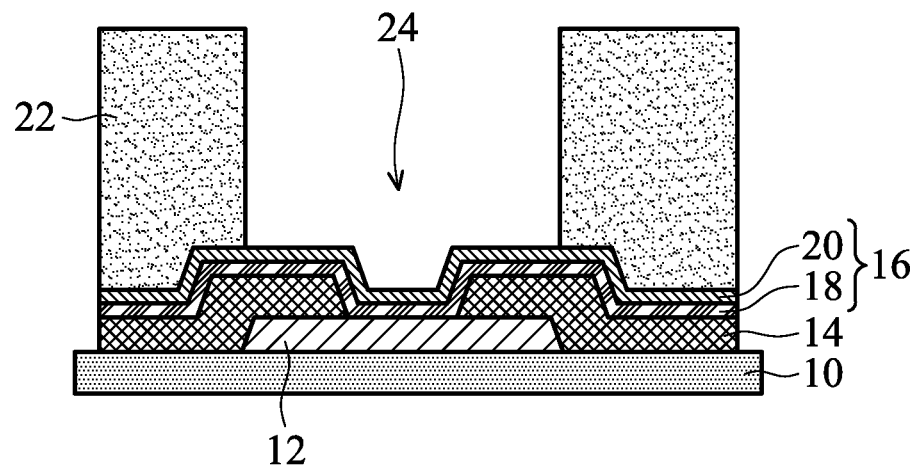
FIGS. 1~9 are cross-sectional views of a portion of a semiconductor device at various stages in an integrated circuit manufacturing process in accordance with an exemplary embodiment.

This disclosure provides embodiments of processes of forming sidewall spacers and top caps for Cu pillar bump technology. The sidewall spacer, serving as a protection structure on the sidewalls of the Cu pillar bump, is formed by having at least one of several non-metal material layers, for example a dielectric material layer, a polymer material layer, or combinations thereof. The top cap, serving as a barrier structure on the top surface of the Cu pillar bump for preventing copper from diffusing into bonding material, includes at least one metal layer formed by electroless or immersion metal deposition process, for example an ENEPIG structure (a stack of an electroless nickel (Ni)/electroless palladium (Pd)/immersion gold (Au) layers), an ENEP structure (a stack of an electroless nickel (Ni)/electroless palladium (Pd) layers), and EN layer (an electroless nickel (Ni) layer), an ENIG structure (a stack of an electroless nickel (Ni)/immersion gold (Au) layers), or combinations thereof. As employed throughout this disclosure, the term "Cu pillar bump" refers to a bump structure comprising a conductive pillar (a post or a standoff) comprising copper or copper alloys. The Cu pillar bump may be applied directly on an electrical pad, a redistribution layer on a semiconductor chip for a flip chip assembly, or other similar applications.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, an apparatus in accordance with the present disclosure. It is to be understood that elements not specifically shown or described may take various forms. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1~9 are cross-sectional views of a portion of a semiconductor device at various stages in an integrated circuit manufacturing process in accordance with an exemplary embodiment.

With reference to FIG. 1, an exemplary semiconductor substrate 10 used for bump fabrication is employed in a semiconductor integrated circuit fabrication, and integrated circuits may be formed therein and/or thereupon. The semiconductor substrate 10 is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; or other suitable elements. Various processes are performed to form the various microelectronic elements including deposition, etching, implantation, photolithography, annealing, or other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, or other suitable types of devices.

The semiconductor substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may comprise copper or copper alloys. One skilled in the art will realize the formation details of the metallization structure. A pad region 12 is a top metallization layer formed in a top-level inter-layer dielectric layer, which is a portion of conductive routes and has an exposed surface treated by a planarization process, such as chemical mechanical polishing (CMP), if necessary. Suitable materials for the pad region may include, but are not limited to, for example, copper (Cu), aluminum (Al), AlCu, copper alloy, or other mobile conductive materials. The pad region is used in the bonding process to connect the integrated circuits in the respective chip to external features.

FIG. 1 also shows a passivation layer 14 formed overlying the semiconductor substrate 10 and exposing a portion of the pad region 12 for subsequent Cu pillar bump processes. The passivation layer 14 comprises a non-organic material selected from un-doped silicate glass (USG), silicon nitride, silicon oxynitride, silicon oxide, or combinations thereof. In some alternative embodiments, the passivation layer 14 comprises a polymer layer, such as an epoxy, polyimide, benzocyclobutene (BCB), polybenzoxazole (PBO), or the like, although other relatively soft, often organic, dielectric materials can also be used.

FIG. 1 further shows the formation of an under-bump-metallurgy (UBM) layer 16 including a first UBM layer 18 and a second UBM layer 20 on the substrate 10. For example, the UBM layer 16 is formed on the exposed portion of the pad region 12, and extends over a portion of the passivation layer 14. In some embodiments, the first UBM layer 18, also referred to as a diffusion barrier layer or a glue layer, comprises titanium, tantalum, titanium nitride, tantalum nitride, or the like by physical vapor deposition (PVD) or sputtering. The first UBM layer 18 is deposited to a thickness of between about 500 and 2000 angstrom, and in some embodiment for example, to a thickness of about 1000 Angstrom. The second UBM layer 20 is a copper seed layer formed on the first UBM layer 18 by physical vapor deposition (PVD) or sputtering. The second UBM layer 20 may comprise copper alloys that include silver, chromium, nickel, tin, gold, or combinations thereof. The second UBM layer 20 is deposited to a thickness of between about 500 and 10000 angstrom, and in some embodiment for example, to a thickness of about 5000 Angstrom. In one embodiment, the UBM layer 16 includes a first UBM layer 18 formed of Ti and a second UBM layer 20 formed of Cu.

FIG. 1 further shows the formation a mask layer 22 on the UBM layer 16. The mask layer 22 is patterned to form opening 24 therein so as to expose a portion of the UBM layer 16 for Cu pillar bump formation. The mask layer 22 may be a dry film or a photoresist film, which may be patterned by lithography and/or etching processes.

Figure 2:
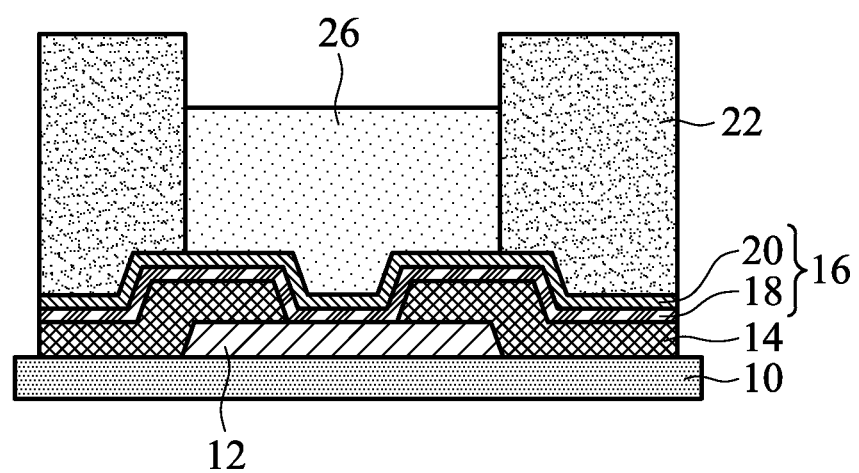

With reference to FIG. 2, there is shown the formation of a conductive material with solder wettability in the opening 24. In an embodiment, a copper (Cu) layer 26 is formed in the opening 24 to contact the underlying UBM layer 16. As used throughout this disclosure, the term "copper (Cu) layer" is intended to include substantially a layer including pure elemental copper, copper containing unavoidable impurities, or copper alloys containing minor amounts of elements such as tantalum, indium, tin, zinc, manganese, chromium, titanium, germanium, strontium, platinum, magnesium, aluminum, or zirconium. The formation methods may include sputtering, printing, electro plating, electroless plating, or chemical vapor deposition (CVD) methods. For example, electro-chemical plating (ECP) is carried out to form the Cu layer 26. In an exemplary embodiment, the thickness of the Cu layer 26 is greater than 25 μm. In another exemplary embodiment, the thickness of the Cu layer 26 is greater than 40 μm. For example, the Cu layer 26 is about 40-50 µm thick, or about 40-70 µm thick, although the thickness may be greater or smaller.

Figure 3:
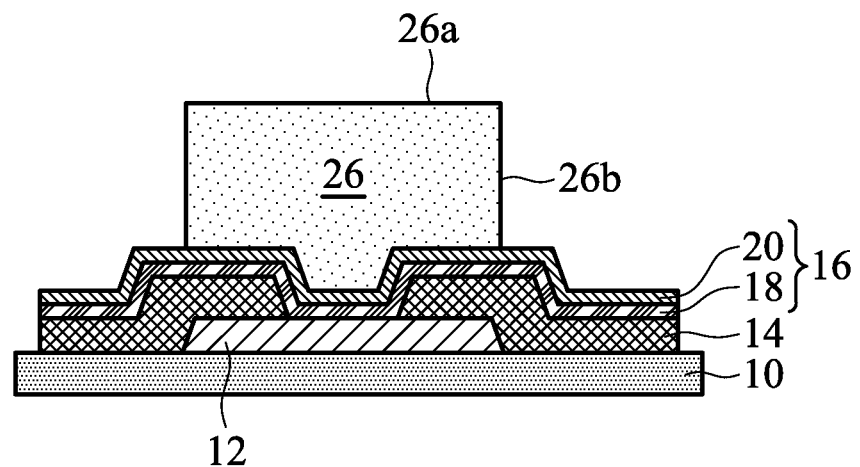

With reference to FIG. 3, the process proceeds to remove the mask layer 22, thus the top surface 26a and sidewall surfaces 26b of the Cu layer 26 are exposed. The Cu layer 26 protruding from the UBM layer 16 is referred to as a Cu pillar 26 hereinafter. A portion of the second UBM layer 20 not covered by the Cu layer 26 is also exposed at this step. In the case the mask layer 22 is a dry film, it may be removed using an alkaline solution. If the mask layer 22 is formed of photoresist, it may be removed using acetone, n-methyl pyrrolidone (NMP), dimethyl sulfoxide (DMSO), aminoethoxy ethanol, or the like.

Figure 4:
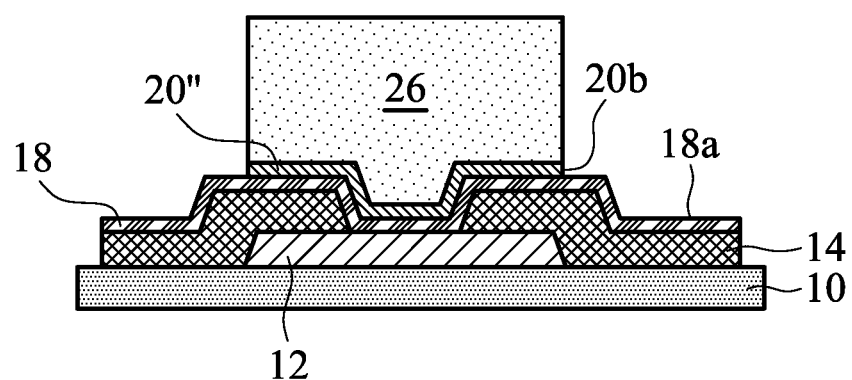

Then as shown in FIG. 4, the exposed portion of the second UBM layer 20 is etched to expose a portion 18a of the underlying first UBM layer 18 not covered by the Cu pillar 26. In an exemplary embodiment, the step of removing a portion of the second UBM layer 20 is a dry etching or a wet etching. For example, an isotropic wet etching (often referred to as flash etching due to its short duration) using an ammonia-based acid is employed. Thus, underlying the Cu pillar 26, the patterned second UBM layer 20" has exposed sidewall surfaces 20b.

Figure 5:
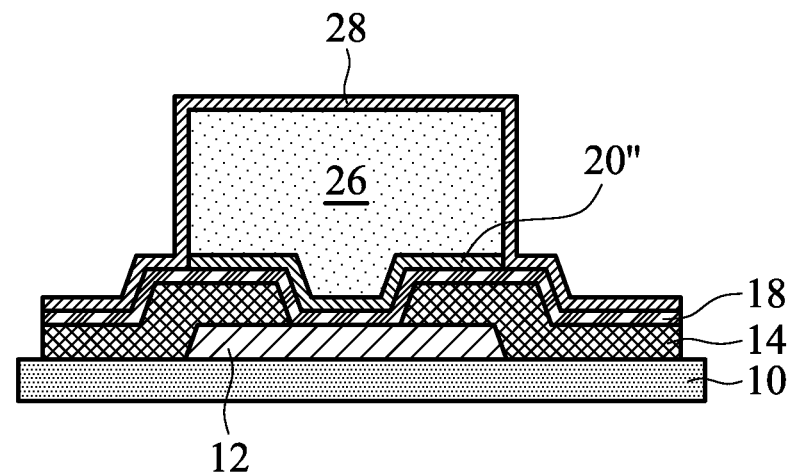

With reference to FIG. 5, a protection layer 28 is formed on the resulting structure, for example by a blanket deposition. In some embodiments, the protection layer 28 is deposited to cover the top surface 20a and the sidewall surfaces 20b of the Cu pillar 20, the sidewall surfaces 20b of the patterned second UBM layer 20", and the exposed portion 18a of the first UBM layer 18. The protection layer 28 is a non-metal material layer, for example a dielectric material layer, a polymer material layer, or combinations thereof. The protection layer 28 may comprise a single material layer or a multi-layered structure. The protection layer 28 is between about 500 Angstroms to about 10000 Angstroms thick. In one embodiment, the protection layer 28 is a dielectric material layer formed of silicon nitride, silicon oxide, silicon oxynitride, silicon carbide, alternating layers of silicon oxide and silicon nitride, or combinations thereof by using any of a variety of deposition techniques, including thermal oxidation, low-pressure chemical vapor deposition (LPCVD), atmospheric-pressure chemical vapor deposition (APCVD), or plasma-enhanced chemical vapor deposition (PECVD). In one embodiment, the protection layer 28 is a polymer material layer comprising a polymer, such as an epoxy, polyimide, benzocyclobutene (BCB), polybenzoxazole (PBO), or the like, although other relatively soft, often organic, dielectric materials can also be used. The polymer material layer is soft, and hence has the function of reducing inherent stresses on respective portions of the substrate. In addition, the polymer layer is easily formed to a thickness of tens of microns.

Figure 6:
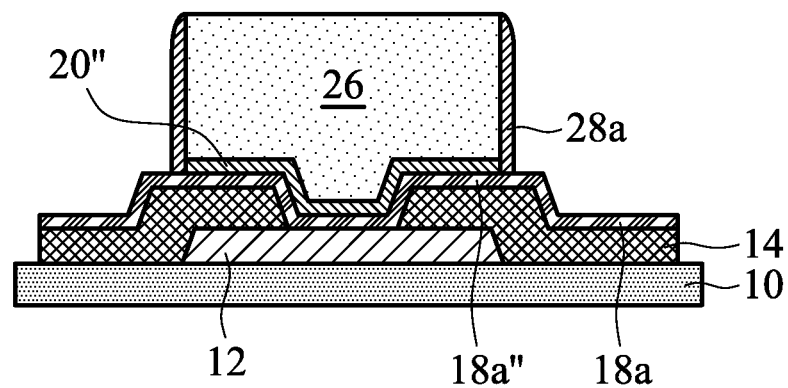

Next, referring to FIG. 6, certain regions of the protection layer 28 are removed to form a sidewall spacer 28a, leaving the portion along the sidewall surfaces 26b and 20b but not the portion overlying the top surface 26a of the Cu pillar 26. In some embodiments, the sidewall spacer 28a is also referred to as a sidewall protection structure 28a. The sidewall spacer 28a extends to land on a surface region 18a" of the exposed portion 18a. Advances in lithography and masking techniques and dry etch processes, such as Reactive Ion Etching (RIE) or other plasma etching processes, allow production of the sidewall spacer 28a.

Figure 7:
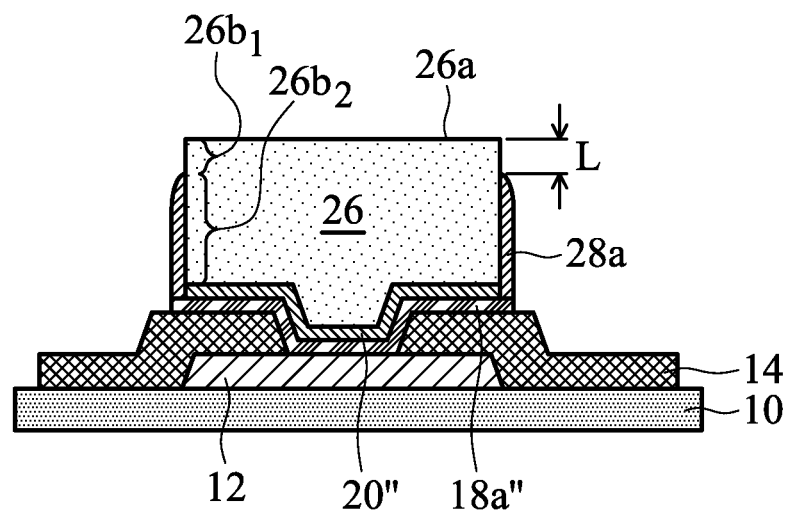

In FIG. 7, a portion of the first UBM layer 18 is then etched using the created structure 28a as the mask, exposing the underlying passivation layer 14. A dry etching process, such as standard RIE procedures, using $Cl_2/BCl_3$ as an etchant, is used to etch the first UBM layer 18. The dry etching process removes most part of the exposed portion 18a, except for the surface region 18a" adjacent to the sidewall surface 20b of the patterned second UBM layer 20" and covered by the sidewall spacer 28a. Since the surface region 18a" extends outwardly from the sidewall surface 20b of the patterned second UBM layer 20", the area of the patterned first UBM layer 18" is greater than the area of the patterned second UBM layer 20". However, during the dry etching process, some of the sidewall spacer 28b are also removed from the upper portion $26b_1$ of the sidewall surface 26b of the Cu pillar 26, causing the upper portion $26b_1$ of the sidewall surface 26b being exposed at this step. The exposed upper portion $26b_1$ has a length L between 2~8 µm.

Figure 8:
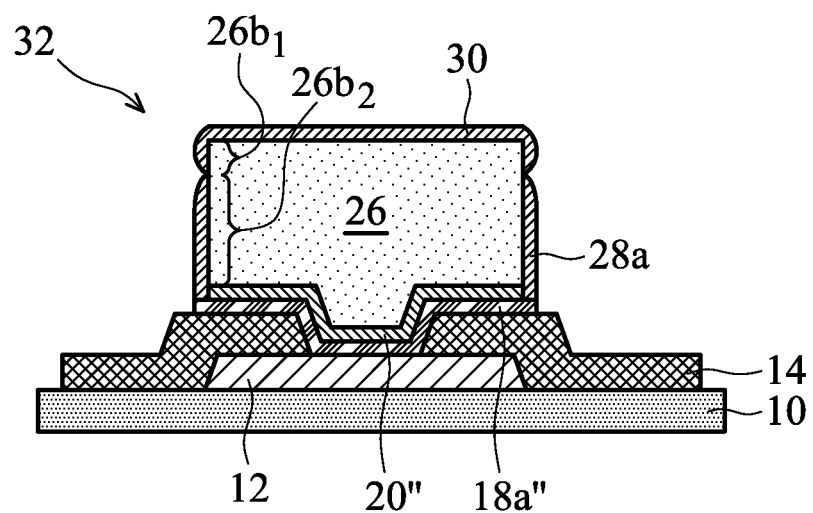

In order to protect the exposed upper portion $26b_1$ and cap the top surface 26a of the Cu pillar 26, the process proceeds to the formation of a top cap on the Cu pillar 26. As shown in FIG. 8, a cap layer 30 is formed on the top surface 26a, and extends to cover the exposed upper portion $26b_1$ of the sidewall surface 26b. The cap layer 30 could act as a barrier layer to prevent copper in the Cu pillar from diffusing into bonding material, such as solder alloy, that is used to bond the substrate 10 to external features. The prevention of copper diffusion increases the reliability and bonding strength of the package. The cap layer 30 may include nickel (Ni), tin, tin-lead (SnPb), gold (Au), silver, palladium (Pd), indium (In), nickel-palladium-gold (NiPdAu), nickel-gold (NiAu), Ni-base alloy, Au-base alloy, or Pd-base alloy, other similar materials, or alloy by electroless plating process or immersion plating process. The cap layer 30 has a thickness about 0.1-10 µm. In one embodiment, the cap layer 30 is a triple-layer structure including an electroless Ni layer, an electroless Pd layer, and an immersion Au layer, which is also known as an ENEPIG scheme. In one embodiment, the cap layer 30 is a dual-layer structure including an electroless Ni layer and an electroless Pd layer, named an ENEP scheme. In one embodiment, the cap layer 30 is a single-layer structure including an electroless Ni layer, which is also known as an EN scheme. In one embodiment, the cap layer 30 is a dual-layer structure including an electroless Ni layer and an immersion Au layer, which is also known as an ENIG scheme.

The completed bump structure 32 includes the Cu pillar 26, the patterned second UBM layer 20", the patterned first UBM layer 18", the sidewall spacer 28a, and the cap layer 30. The substrate 10 is then sawed and packaged onto a package substrate, or another die, with solder balls or Cu bumps mounted on a pad on the package substrate or the other die.

Figure 9:
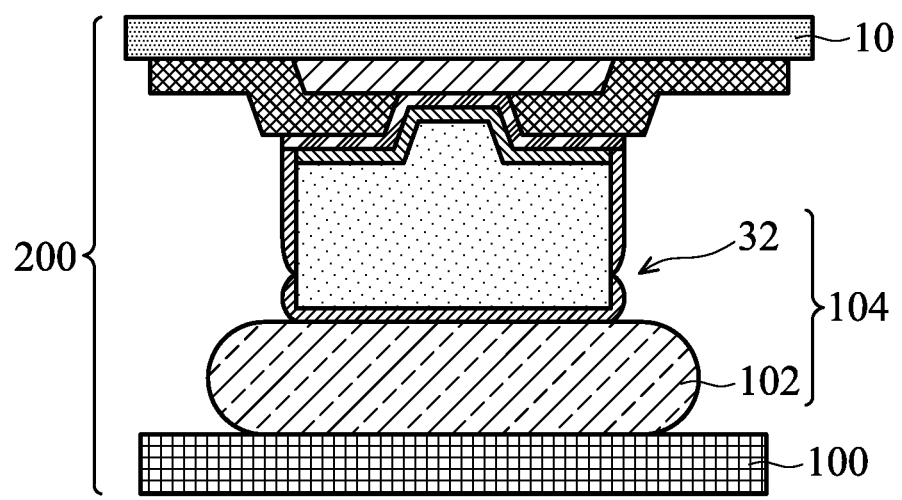

FIG. 9 is a cross-sectional diagram depicting an exemplary embodiment of a flip-chip assembly. The structure shown in FIG. 8 is flipped upside down and attached to another substrate 100 at the bottom. The substrate 100 may be a package substrate, board (e.g., a print circuit board (PCB)), or other suitable substrate. The bump structure 32 is coupled to the substrate 100 through various conductive attachment points, for example, a joint solder layer 102 on contact pads and/or conductive traces, to form a joint structure 104, which couples the two substrates 10 and 100. The joint solder layer 102 may be a eutectic solder material including alloys of tin, lead, silver, copper, nickel, bismuth, or combinations thereof. An exemplary coupling process includes a flux application, chip placement, reflowing of melting solder joints, and/or cleaning of flux residue. The integrated circuit substrate 10, the joint structure 104, and the other substrate 100 may be referred to as a packaging assembly 200, or in the present embodiment, a flip-chip packaging assembly.

The disclosure provides a sidewall spacer comprising a non-metal material on the lower sidewall portion of the Cu pillar to prevent the Cu pillar sidewall from oxidation and increase adhesion between the Cu pillar sidewall and a subsequently formed underfill material. Compared with the conventional immersion Sn method followed by an annealing process, the non-metal sidewall protection structure can adjust substrate stress, and prevent solder wetting to the Cu pillar around the perimeter of the UBM layer during the reflow process. This is applicable to fine pitch bump schemes. The disclosure also provides a top cap comprising a metal material on the top surface and the upper sidewall portion of the Cu pillar to prevent copper diffusion from the Cu pillar into the bonding material. Since the top cap process is performed by electroless or immersion plating technique after the sidewall spacer formation, those photoresist leaching and residue problems are alleviated, and the deposition alignment of the top cap on the top surface and the upper sidewall portion of the Cu pillar can be well controlled. Moreover, the use of ENEPIG, ENEP, EN, or ENIG scheme as the top cap of the Cu pillar bump can decrease the probability of bump collapse and increase the package reliability.

One aspect of this description relates to a method of forming an integrated circuit device. The method includes forming a conductive element over a substrate, wherein the conductive element is over an under bump metallurgy (UBM) layer, and the UBM layer comprises a first UBM layer and a second UBM layer over the first UBM layer. The method further includes etching the second UBM layer to expose a portion of the first UBM layer beyond a periphery of the conductive element. The method further includes forming a protection layer over sidewalls of the conductive element, over sidewalls of the second UBM layer and over a top surface of the first UBM layer. The method further includes etching the first UBM layer to remove a portion of the first UBM layer. The method further includes forming a cap layer over a top surface of the conductive element.

Another aspect of this description relates to a method of forming an integrated circuit device. The method includes plating a conductive element over a first substrate, wherein the conductive element is over an under bump metallurgy (UBM) layer, and the UBM layer comprises a first UBM layer and a second UBM layer over the first UBM layer. The method further includes depositing a protection layer over sidewalls of the conductive element, over sidewalls of the second UBM layer and over a top surface of the first UBM layer, wherein the protection layer exposes an upper portion of the sidewalls of the conductive element. The method further includes forming a cap layer over a top surface and the upper portion of the sidewalls of the conductive element. The method further includes bonding the conductive element to a second substrate using a solder layer, wherein the cap layer is between the conductive element and the solder layer.

Still another aspect of this description relates to a method of forming an integrated circuit device. The method includes plating a conductive element over a first substrate, wherein the conductive element is over an under bump metallurgy (UBM) layer, and the UBM layer comprises a first UBM layer and a second UBM layer over the first UBM layer. The method further includes depositing a protection layer over sidewalls of the conductive element, over sidewalls of the second UBM layer and over a top surface of the first UBM layer. The method further includes etching the first UBM layer using the protection layer as a mask, wherein etching the first UBM layer comprises removing the protection layer from an upper portion of the sidewalls of the conductive element. The method further includes forming a multi-layered cap layer over a top surface and the upper portion of the sidewalls of the conductive element. The method further includes bonding the conductive element to a second substrate using a solder layer, wherein the cap layer is between the conductive element and the solder layer.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of the inventive concepts as expressed herein.

What is claimed is:

1. A method of forming an integrated circuit device, the method comprising:
    forming a conductive element over a substrate, wherein the conductive element is over an under bump metallurgy (UBM) layer, and the UBM layer comprises a first UBM layer and a second UBM layer over the first UBM layer;
    etching the second UBM layer to expose a portion of the first UBM layer beyond a periphery of the conductive element;
    forming a protection layer over sidewalls of the conductive element, over sidewalls of the second UBM layer and directly contacting a top surface of the first UBM layer;
    etching the first UBM layer to remove a portion of the first UBM layer, wherein etching first UBM layer comprises removing the protection layer from an upper portion of the sidewalls of the conductive element; and
    forming a cap layer over a top surface of the conductive element.

2. The method of claim 1, wherein forming the conductive element comprises:
    forming a mask layer over the UBM layer;
    patterning the mask layer to form an opening in the mask layer; and
    forming the conductive element in the opening.

3. The method of claim 1, wherein the conductive element is formed by sputtering, printing, electro plating, electroless plating, electro-chemical plating or chemical vapor deposition.

4. The method of claim 1, wherein etching the second UBM layer comprises a wet etching process.

5. The method of claim 1, wherein forming the protection layer comprises forming the protection layer having a thickness ranging from about 500 angstroms to about 10,000 angstroms.

6. The method of claim 1, wherein forming the protection layer comprises forming the protection layer comprising at least one layer of a dielectric material.

7. The method of claim 1, further comprising etching the protection layer to expose the portion of the first UBM layer.

8. The method of claim 7, wherein etching the protection layer comprises removing the protection layer from the top surface of the conductive element.

9. The method of claim 1, wherein the first UBM layer is etched using a dry etching process.

10. The method of claim 1, wherein forming the cap layer comprises forming the cap layer over the upper portion of the sidewalls of the conductive element.

11. The method of claim 1, wherein removing the protection layer from the upper portion of the sidewalls comprises exposing the upper portion of the sidewalls of the conductive having a length ranging from about 2 microns (μm) to about 8 μm.

12. The method of claim 1, further comprising bonding the conductive element to a second substrate.

13. The method of claim 12, wherein bonding the conductive element to the second substrate comprises reflowing a solder layer between the conductive element and the second substrate, and the cap layer is between the conductive element and the solder layer.

14. A method of forming an integrated circuit device, the method comprising:
   plating a conductive element over a first substrate, wherein the conductive element is over an under bump metallurgy (UBM) layer, and the UBM layer comprises a first UBM layer and a second UBM layer over the first UBM layer;
   depositing a protection layer over sidewalls of the conductive element, over sidewalls of the second UBM layer and over a top surface of the first UBM layer, wherein the protection layer exposes an upper portion of the sidewalls of the conductive element;
   forming a cap layer over a top surface and the upper portion of the sidewalls of the conductive element; and
   bonding the conductive element to a second substrate using a solder layer, wherein the cap layer is between the conductive element and the solder layer.

15. The method of claim 14, wherein bonding the conductive element to the second substrate comprises bonding the conductive element to a contact pad or a conductive trace.

16. The method of claim 14, wherein plating the conductive element comprises plating a copper-containing material.

17. The method of claim 14, further comprising etching the first UBM layer using the protection layer over the sidewalls of the conductive element as a mask.

18. The method of claim 14, wherein plating the conductive element comprises:
   forming a mask layer over a top surface of the second UBM layer;
   patterning the mask layer to form an opening; and
   plating the conductive element in the opening.

19. A method of forming an integrated circuit device, the method comprising:
   plating a conductive element over a first substrate, wherein the conductive element is over an under bump metallurgy (UBM) layer, and the UBM layer comprises a first UBM layer and a second UBM layer over the first UBM layer;
   depositing a protection layer over sidewalls of the conductive element, over sidewalls of the second UBM layer and over a top surface of the first UBM layer;
   etching the first UBM layer using the protection layer as a mask, wherein etching the first UBM layer comprises removing the protection layer from an upper portion of the sidewalls of the conductive element;
   forming a multi-layered cap layer over a top surface and the upper portion of the sidewalls of the conductive element; and
   bonding the conductive element to a second substrate using a solder layer, wherein the cap layer is between the conductive element and the solder layer.

20. The method of claim 19, wherein bonding the conductive element to the second substrate comprises bonding the conductive element to a contact pad or a conductive trace.

* * * * *